US012660274B2

(12) United States Patent
Tsuji

(10) Patent No.: US 12,660,274 B2
(45) Date of Patent: Jun. 16, 2026

(54) SILICON CARBIDE SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Takashi Tsuji, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 289 days.

(21) Appl. No.: 18/340,323

(22) Filed: Jun. 23, 2023

(65) Prior Publication Data

US 2024/0055375 A1 Feb. 15, 2024

(30) Foreign Application Priority Data

Aug. 9, 2022 (JP) ................................. 2022-127281

(51) Int. Cl.
H01L 23/00 (2006.01)
H01L 21/04 (2006.01)

(52) U.S. Cl.
CPC .......... H01L 24/05 (2013.01); H01L 21/0445 (2013.01); H01L 21/045 (2013.01); H01L 21/048 (2013.01); H01L 21/0485 (2013.01); H01L 24/03 (2013.01); *H01L 24/91* (2013.01); *H01L 2224/031* (2013.01);
(Continued)

(58) Field of Classification Search
CPC . H01L 21/0445; H01L 21/045; H01L 21/048;
H01L 21/0485; H01L 24/04–06; H01L 2224/031; H01L 2224/03848; H01L 2224/05562; H01L 2224/05564; H01L 2924/10272
See application file for complete search history.

(56) References Cited

U.S. PATENT DOCUMENTS

2014/0367738 A1 12/2014 Nakajima
2015/0024581 A1 1/2015 Imai

FOREIGN PATENT DOCUMENTS

JP 2000-164593 A 6/2000
JP 3083301 B2 9/2000
(Continued)

OTHER PUBLICATIONS

Office Action issued for corresponding Japanese Patent Application No. 2022-127281, ans its English translation, dated Apr. 7, 2026.
(Continued)

*Primary Examiner* — David A Zarneke
(74) *Attorney, Agent, or Firm* — Rabin & Berdo, P.C.

(57) ABSTRACT

An AlSi electrode containing an aluminum alloy that contains silicon is sputtered on a surface of a semiconductor substrate that contains silicon carbide. Si nodules having a dendrite structure precipitate in AlSi electrode. At least some of the Si nodules have a dendrite structure, and the rest of the Si nodules have a prismatic structure. A height of the Si nodules having either dendrite structures or prismatic structures in the AlSi electrode in a thickness direction of the AlSi electrode is not more than 2 μm. A height of the Si nodules having the dendrite structures in the AlSi electrode, preferably, may be 1 μm or less. A solid solubility of silicon in the AlSi electrode is in a range of 0.3 wt % to 1.59 wt %. A sputtering temperature of the AlSi electrode is in a range of 430 degrees C. to 577 degrees C.

2 Claims, 13 Drawing Sheets

(52) U.S. Cl.
CPC .............. *H01L 2224/03848* (2013.01); *H01L 2224/05124* (2013.01); *H01L 2224/05562* (2013.01); *H01L 2224/05564* (2013.01); *H01L 2924/0483* (2013.01); *H01L 2924/10272* (2013.01)

(56) References Cited

FOREIGN PATENT DOCUMENTS

| | | | |
|---|---|---|---|
| JP | 2013222907 A | 10/2013 | |
| WO | 2013172394 A1 | 11/2013 | |

OTHER PUBLICATIONS

Hiroshi Goto, et al., "Aluminium-Alloy Interconnection Material with Higher Mechanical Strength for Si-IGBT Devices", R d Research and Development Kobe Steel Engineering Reports, Kobe Steel, Ltd., vol. 65, No. 2, pp. 58-61, Sep. 2015; with English abstract.

PRISMATIC STRUCTURE

PRISMATIC STRUCTURE

PRISMATIC STRUCTURE

DENDRITE STRUCTURE

FIG.6

| SUBSTRATE TEMPERATURE DURING DEPOSITION OF AlSi ELECTRODE | PRECIPITATED MORPHOLOGY OF Si NODULE | PRISM PERCENTAGE | PRISM HEIGHT | DENDRITE PERCENTAGE | DENDRITE HEIGHT | PEELING |
|---|---|---|---|---|---|---|
| 350°C | PRISM | 100% | 5μm AT MOST | 0% | — | YES |
| 400°C | PRISM | 100% | 5μm AT MOST | 0% | — | YES |
| 410°C | PRISM+DENDRITE | 98% TO 100% | 3μm AT MOST | 2% OR LESS | 1μm OR LESS | YES |
| 420°C | PRISM+DENDRITE | 95% TO 100% | MORE THAN 2μm BUT NOT MORE THAN 3μm | 5% OR LESS | 1μm OR LESS | YES |
| 430°C | PRISM+DENDRITE | 90% OR LESS | 2μm AT MOST | 10% OR MORE | 1μm OR LESS | NO |
| 440°C | PRISM+DENDRITE | 20% OR LESS | 2μm AT MOST | 80% OR MORE | 1μm OR LESS | NO |
| 450°C | DENDRITE | 0% | — | 100% | 1μm OR LESS | NO |
| 500°C | DENDRITE | 0% | — | 100% | 1μm OR LESS | NO |

SILICON CARBIDE SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2022-127281, filed on Aug. 9, 2022, the entire contents of which are incorporated herein by reference.

BACKGROUND OF THE INVENTION

1. Field of the Invention

Embodiments of the invention relate to a silicon carbide semiconductor device and a method of manufacturing a semiconductor device.

2. Description of the Related Art

Conventionally, aluminum (Al) containing silicon (Si) is used as an electrode material of a surface electrode at a front surface of a semiconductor substrate. The surface electrode at the front surface of the semiconductor substrate is formed so as to be embedded in a contact hole of an interlayer insulating film. Therefore, reflow sputtering that softens and embeds by a heat treatment (reflow) while depositing (forming) by sputtering has been proposed as a method to enhance embeddability of a surface electrode that uses aluminum containing silicon as an electrode material (hereinafter, AlSi electrode).

In an instance in which silicon (Si) is used as a semiconductor material, the semiconductor substrate and an AlSi electrode are exposed to a high temperature while being in contact with each other and interdiffusion of silicon atoms in the semiconductor substrate and aluminum atoms in the AlSi electrode easily occurs. Aluminum atoms diffused in the semiconductor substrate from the AlSi electrode form an alloy with the silicon atoms in the semiconductor substrate, whereby protrusions (alloy spikes) that protrude from the AlSi electrode are locally formed in the semiconductor substrate. When the alloy spikes progress to a pn junction in the semiconductor substrate, there is concern of device failure due to characteristics degradation.

Silicon atoms diffused in the AlSi electrode from the semiconductor substrate precipitate as silicon (Si) nodules, close to an interface between the AlSi electrode and the semiconductor substrate and electrical resistance at the interface between the semiconductor substrate and the AlSi electrode increases. It is known than when a temperature (hereinafter, sputtering temperature) of the semiconductor substrate during sputtering of the AlSi electrode is set to a relatively low temperature (less than 309 degrees), interdiffusion of the silicon atoms in the semiconductor substrate and the aluminum atoms in the AlSi electrode is suppressed, whereby the progression of alloy spikes and the precipitation of Si nodules are suppressed.

Further, in an instance in which an aspect ratio of the contact hole in the interlayer insulating film is large, a method is used in which tungsten (W), which has greater embeddability than that of aluminum, is embedded in the contact hole of the interlayer insulating film, using chemical vapor deposition (CVD). The AlSi electrode is deposited on a tungsten plug (W plug) embedded in the contact hole of the interlayer insulating film, whereby the AlSi electrode and the semiconductor substrate are not in direct contact and thus, the occurrence of alloy spikes is suppressed.

On the other hand, in an instance in which silicon carbide (SiC) is used as a semiconductor material, even when the sputtering temperature of the AlSi electrode is set to 300 degrees C. or greater, the occurrence of alloy spikes is inhibited. A reason for this is that, in addition to silicon carbide itself having a small diffusion coefficient (bonding energy between the carbon atoms and silicon atoms of silicon carbide is great), a silicide film for ohmic contact with the semiconductor substrate is formed between the semiconductor substrate and the AlSi electrode, whereby interdiffusion of the silicon atoms in the semiconductor substrate and the aluminum atoms in the AlSi electrode is suppressed.

A method of suppressing precipitation of Si nodules by setting the sputtering temperature of the AlSi electrode to a temperature close to or less than a recrystallization temperature of the metal material of the AlSi electrode has been proposed as a method of manufacturing a conventional silicon semiconductor device containing silicon as a semiconductor material (for example, refer to Japanese Patent No. 3083301). In Japanese Patent No. 3083301, the sputtering temperature of the AlSi electrode is set to 170 degrees C. or less at which granulation of the silicon atoms diffused in the AlSi electrode is less likely to occur, whereby precipitation of Si nodules in the AlSi electrode is substantially 0%.

Further, as another method of manufacturing the conventional silicon semiconductor device, a method has been proposed in which sputtering is performed successively under a state in which the temperature of the semiconductor substrate is set to a low temperature of 150 degrees C. and under a state in which the temperature is set to a high temperature of 350 degrees C. to thereby deposit the AlSi electrode (for example, refer to Japanese Laid-Open Patent Publication No. 2000-164593). In Japanese Laid-Open Patent Publication No. 2000-164593, Si nodules in the AlSi electrode deposited at the low temperature grow by absorbing the Si nodules in the AlSi electrode deposited by the high temperature and thus, at an intermediate depth of the total thickness of the AlSi electrode, Si nodules precipitate and separation from the barrier metal therebelow occurs.

Further, in another method of manufacturing the conventional silicon semiconductor device, it has been reported that when a bonding wire is pressure bonded to the AlSi electrode, coarse silicon precipitate (Si precipitate) precipitated in the AlSi electrode that is deposited by sputtering is pressed strongly against the semiconductor substrate and cracks occur that reach the semiconductor substrate from locations where the Si precipitate is pressed into the semiconductor substrate (for example, refer to Goto, Hiroshi, et al, "Aluminum-Alloy Interconnection Material with Higher Mechanical Strength for Si-IGBT Devices", Research and Development KOBE STEEL ENGINEERING REPORTS), Kobe Steel, Ltd., September 2015, Vol. 65, No. 2, pp. 58-61). Goto, et al report that device destruction is caused by the cracks originating from the Si precipitate and yield may decrease.

SUMMARY OF THE INVENTION

According to an embodiment of the present invention, a method of manufacturing a semiconductor device having a semiconductor substrate containing silicon carbide and a surface electrode provided at a surface of the semiconductor substrate, the method includes sputtering and thereby depositing the surface electrode on the surface of the semiconductor substrate, the surface electrode containing an aluminum alloy that contains silicon. A silicon concentration of the surface electrode is higher than a solid solubility of silicon in the surface electrode. A temperature of the semiconductor substrate, or a temperature of a vicinity of a region in which the surface electrode is formed, or both is in a range of 430 degrees C. to 577 degrees C.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a table depicting a relationship between the sputtering temperature of the AlSi electrode and an area amount of the Si nodules in the AlSi electrode in the first experimental example.

FIG. 10 is a plan view schematically depicting a state when, a portion of a gate pad of a conventional silicon carbide semiconductor device is viewed from a front side of a semiconductor substrate.

FIG. 11 is a cross-sectional view depicting a structure along cutting line AA-AA' in FIG. 10.

DETAILED DESCRIPTION OF THE INVENTION

Figure 1:
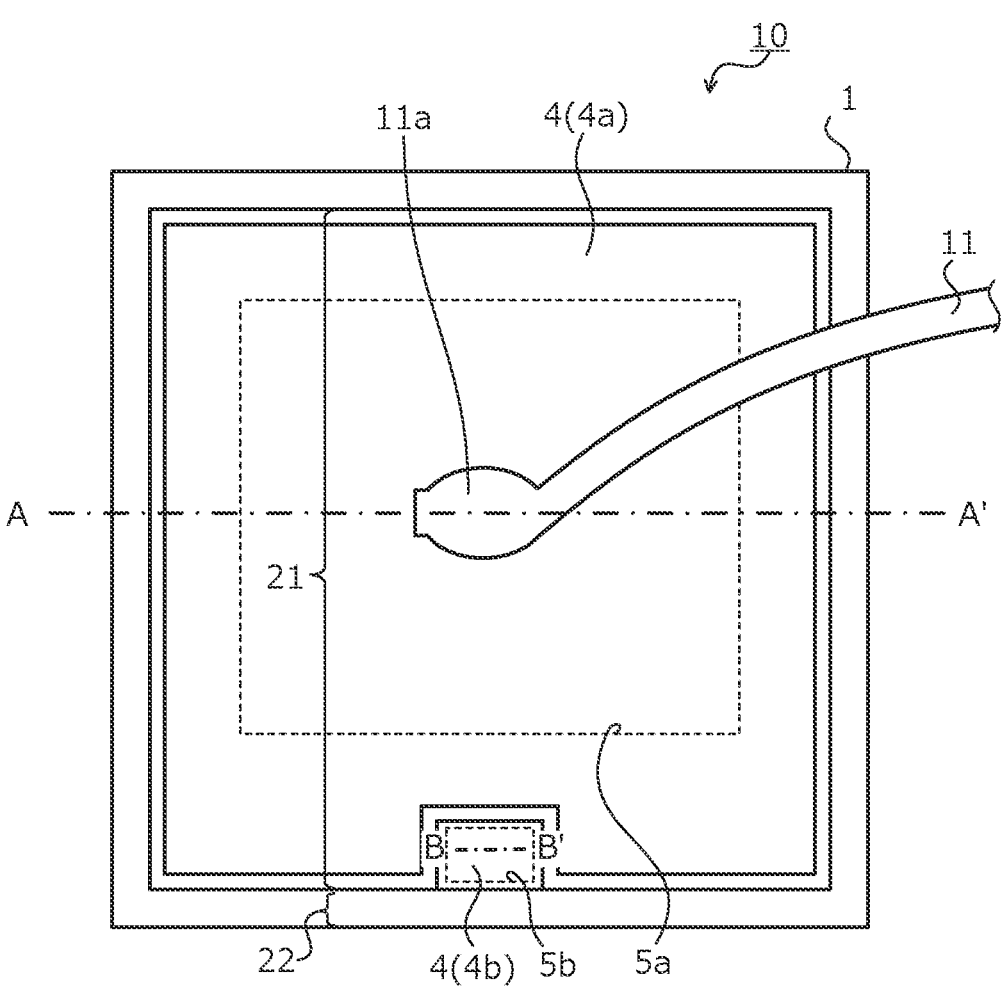
FIG. 1 is a plan view depicting a layout when a silicon carbide semiconductor device according to an embodiment is viewed from a front surface of a semiconductor substrate thereof.

First, problems associated with the conventional techniques are discussed. As described above, when silicon carbide is used as a semiconductor material, embeddability of the AlSi electrode may be enhanced using sputtering alone without embedding a W plug by CVD. Nonetheless, as a result of the earnest research of the present inventors, it was found that when the sputtering temperature of the AlSi electrode is 300 degrees C. or greater, Si nodules that precipitate in the AlSi electrode grow and expand from crystal grains into prismatic shapes in a thickness direction that is orthogonal to the crystal surface of the AlSi electrode (direction orthogonal to and away from the surface of the semiconductor substrate).

It was found that when the Si nodules in the AlSi electrode expand, damage due to load, ultrasonic vibration, etc. applied to the AlSi electrode in the wire bonding process is transmitted to the semiconductor substrate via the Si nodules in the AlSi electrode, whereby cracks that reach the interior of the semiconductor substrate occur close to the Si nodules, the bonding wire peels from the semiconductor substrate, and the like. Goto, et al report that this problem of cracks occurring in the semiconductor substrate due to Si nodules similarly occurs in an instance when silicon is used as a semiconductor material.

Further, in an instance in which Si nodules precipitate in the AlSi electrode, when the AlSi electrodes are patterned to be left at predetermined locations, Si nodules left on the barrier metal after removal of the AlSi electrodes by wet etching have to be removed by dry etching. However, removal of Si nodules that have grown and expanded from crystal grains into prismatic shapes with increased heights in the thickness direction of the AlSi electrode by dry etching requires a long dry etching period and reliability of the barrier metal beneath the AlSi electrode may be adversely affected.

Figure 10:
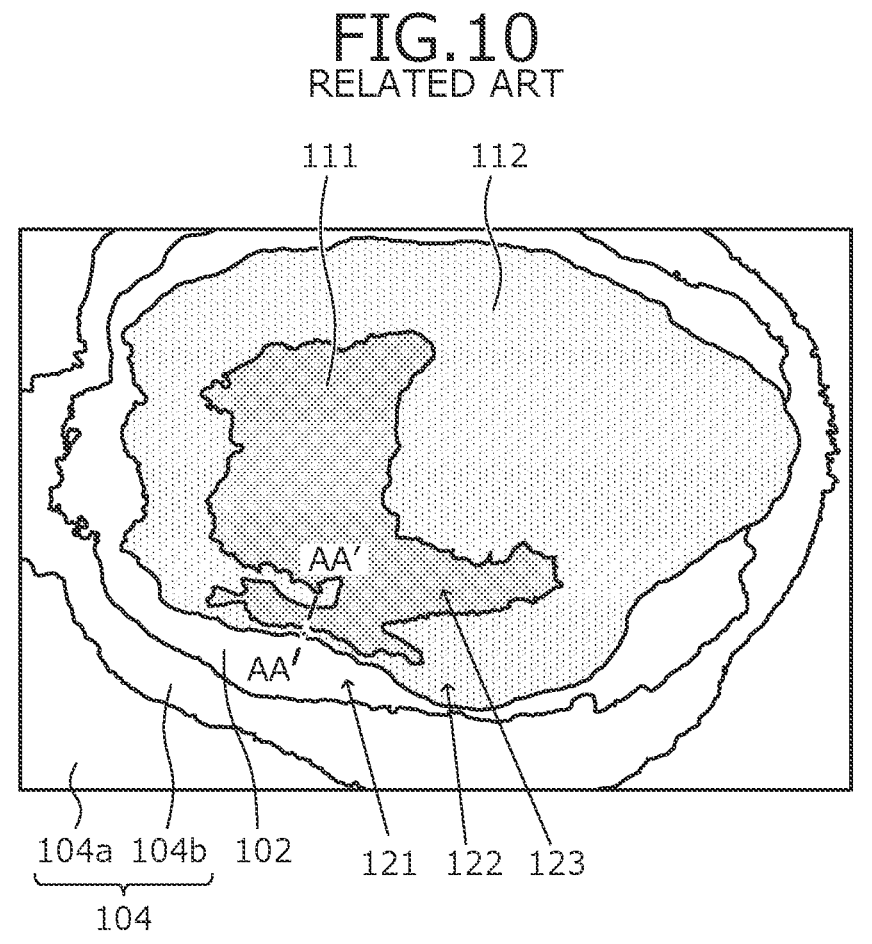
Figure 11:
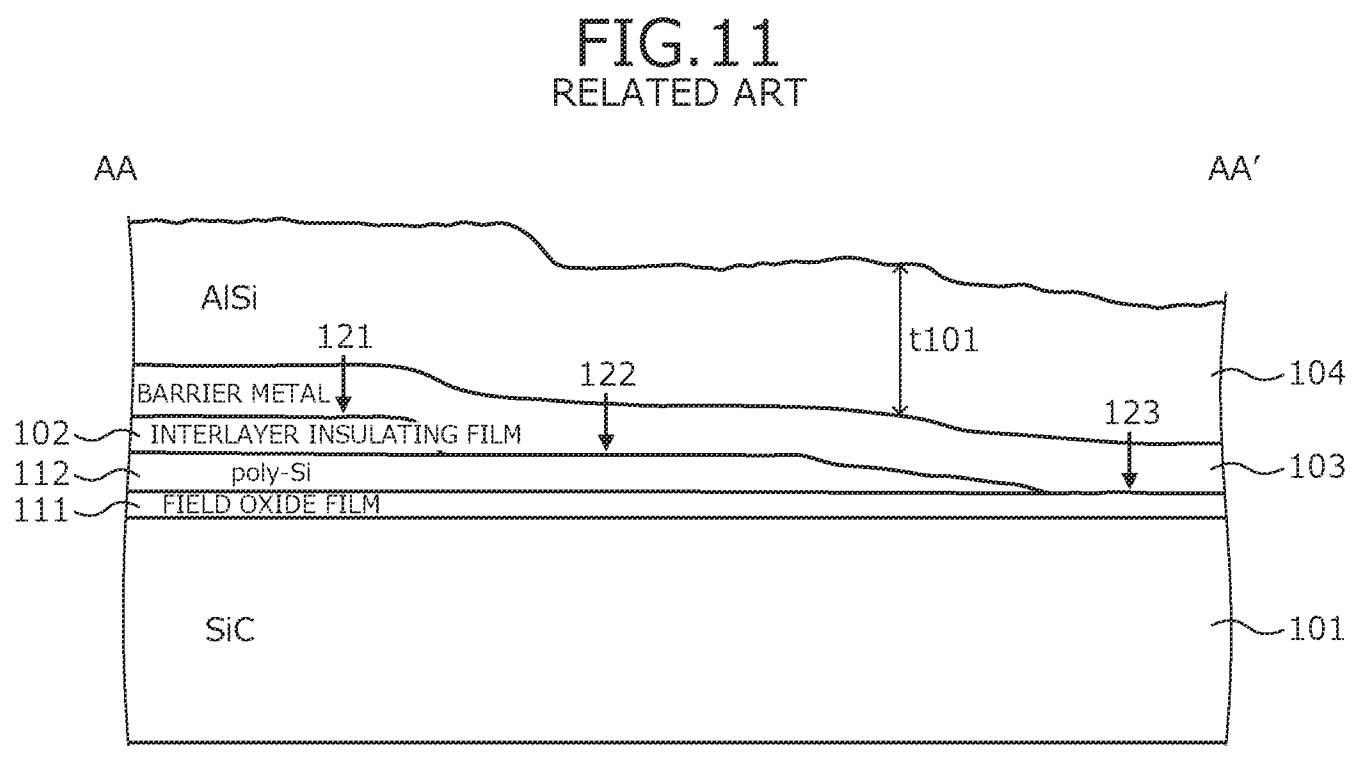

Further, the inventors confirmed that at a portion of the AlSi electrode where the bonding wire is pressed during wire bonding, a portion of the AlSi electrode peels away. FIG. 10 is a plan view schematically depicting a state when, a portion of a gate pad of the conventional silicon carbide semiconductor device is viewed from the front side of the semiconductor substrate. FIG. 10 depicts a peeling location of the gate pad 104. FIG. 11 is a cross-sectional view depicting a structure along cutting line AA-AA' in FIG. 10. FIG. 11 depicts a state of the peeling location and stacked structure beneath the gate pad 104 in FIG. 10.

As depicted in FIG. 10, on a front surface of a semiconductor substrate 101 containing silicon carbide (SiC), a field oxide film 111, a polysilicon (poly-Si) layer 112, an interlayer insulating film 102, a barrier metal 103, and the gate pad 104 are sequentially stacked in the order stated herein. The field oxide film 111 is formed by an initial oxide ($SiO_2$) film and a high temperature oxide (HTO) film sequentially stacked in the order stated herein. The polysilicon layer 112 is a gate wiring layer that constitutes a gate runner.

The interlayer insulating film 102 is formed by, for example, a non-doped silicate glass (NSG) and a borophosphosilicate glass (BPSG) sequentially stacked in the order stated herein. The barrier metal 103 is, for example, a tungsten (W) or (Ti) film, or a titanium nitride (TiN) film, or a metal film in which these films are stacked. The gate pad 104 is an AlSi electrode that contains 1 wt % of Si. The gate pad 104 has a thickness t101 in a range of about 3 μm to 5 μm and, for example, is about 5 μm.

When a bonding wire is pressed to a surface 104a of the gate pad 104, an upper layer partially peels from an interface 123 (upper surface of the HTO) between the polysilicon layer 112 and the field oxide film 111 and slides along interface 123. Along with this, close to the peeling location, at an interface 121 (upper surface of the BPSG) between the barrier metal 103 and the interlayer insulating film 102, and at an interface 122 (upper surface of the polysilicon layer 112) between the interlayer insulating film 102 and the polysilicon layer 112, the upper layers partially peel, and at these peeling locations, each of the upper layers peel and roll up.

At portions where the gate pad 104 has been peeled away and at a rolled-up portion 104b, the interlayer insulating film 102, the polysilicon layer 112, and the field oxide film 111 therebelow are each partially exposed. The AlSi electrode (the gate pad 104) peels at contact locations of the bonding wire and thus, the bonding wire cannot be bonded. As described, peeling of a portion of the AlSi electrode occurs due to damage in the layers therebelow caused by Si nodules, which are harder than the aluminum in the AlSi electrode, being pressed by the bonding wire.

Further, even when the sputtering temperature of the AlSi electrode is set to a low target temperature (less than 300 degrees C.), the sputtering temperature cannot be maintained at the low target temperature, whereby the sputtering temperature fluctuates in a range of 200 degrees C. to 350 degrees C. Thus, when the sputtering temperature fluctuates to be 30 degrees C. or higher, the inventors found that the Si nodules in the AlSi electrode grow from crystal grains into prismatic shapes in the thickness direction and as described above, during the wire bonding, the AlSi electrode and/or portions therebelow peel, whereby the bonding wire peels.

Further, when the AlSi electrode is deposited by low-temperature sputtering of a single wafer, as number of semiconductor wafers successively processed increases, the furnace temperature rises and thus, the sputtering temperature rises. The inventors found that as a result, the probability of partial peeling of the AlSi electrode during wire bonding increases the later a semiconductor wafer is processed among the successively processed semiconductor wafers. The inventors further found that, when bonding wire having a wire gauge (diameter) of 300 μm or more is used, as described above, the probability of partial peeling of the AlSi electrode increases.

In Japanese Patent No. 3083301, the sputtering temperature of the AlSi electrode is low at 170 degrees C. or less and thus, a problem occurs in that the embeddability of the AlSi electrode is poor. In Japanese Laid-Open Patent Publication No. 2000-164593, while low-temperature sputtering and high-temperature sputtering are performed successively to deposit the AlSi electrode, temperature control during the sputtering is difficult. Further, the thickness of an AlSi electrode used in a power device is thick in a range of about 4 μm to 6 μm and even when Japanese Laid-Open Patent Publication No. 2000-164593 is adopted to deposit the AlSi electrode, an effect thereof is difficult to obtain.

Embodiments of a silicon carbide semiconductor device and a method of manufacturing a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 2A:
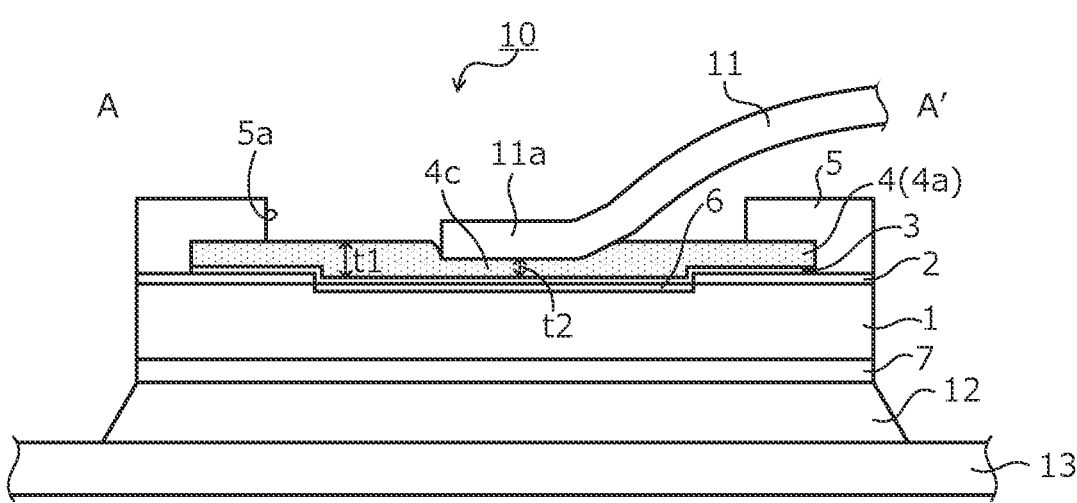
FIG. 2A is a cross-sectional view depicting a structure along cutting line A-A' in FIG. 1.
Figure 2B:
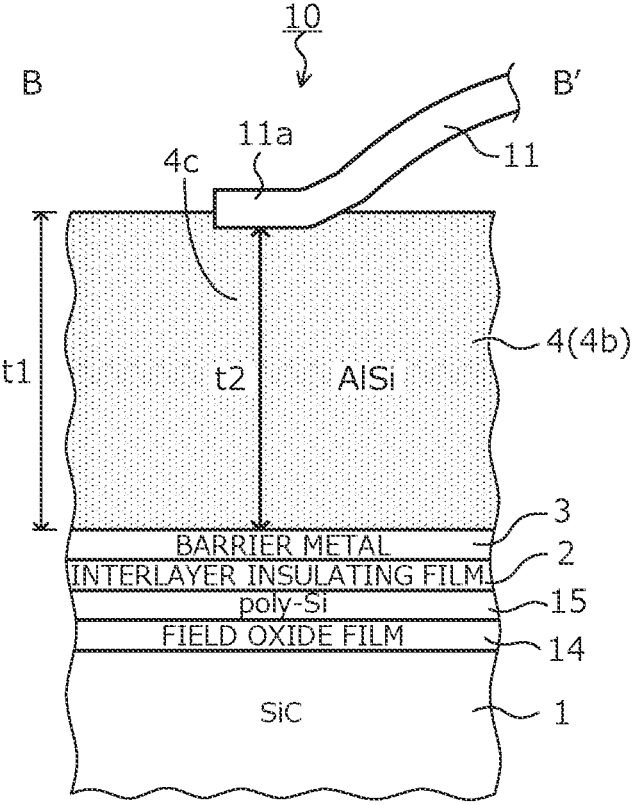
FIG. 2B is a cross-sectional view depicting the structure along cutting line B-B' in FIG. 1.

As structure of a silicon carbide semiconductor device according to an embodiment is described. FIG. 1 is a plan view depicting a layout when the silicon carbide semiconductor device according to the embodiment is viewed from a front surface of a semiconductor substrate thereof. FIG. 1 depicts a state after mounting of a silicon carbide semiconductor device 10. In FIG. 1, openings 5a, 5b in a passivation film 5 are indicated by a dashed line and a soldering layer 12 and a mounting substrate 13 are not depicted. FIGS. 2A and 2B are cross-sectional views depicting the structure along cutting line A-A' and cutting line B-B' in FIG. 1, respectively. In FIGS. 2A and 2B, a device structure (regions in a semiconductor substrate 1) of the silicon carbide semiconductor device 10 are not depicted.

The silicon carbide semiconductor device 10 according to the embodiment depicted in FIGS. 1, 2A, and 2B includes at a main surface of the semiconductor substrate (semiconductor chip) 1 that contains silicon carbide (SiC), a surface electrode (hereinafter, AlSi electrode) 4 that contains, as an electrode material, an aluminum (Al) alloy containing silicon (Si). In FIGS. 1, 2A, and 2B, while a vertical semiconductor device having an AlSi electrode 4 at the front surface of the semiconductor substrate 1 is depicted as the silicon carbide semiconductor device 10, the configuration may be variously modified provided at least one AlSi electrode 4 is provided on at least one main surface of the semiconductor substrate 1.

The semiconductor substrate 1 may be a bulk substrate that is an individual chip cut from a semiconductor ingot (semiconductor single crystal boule) or may be an epitaxial substrate in which an epitaxial layer of a predetermined conductivity type is epitaxially grown on a bulk substrate (starting substrate). The semiconductor substrate 1 has an active region 21 and an edge termination region 22 that surrounds a periphery of the active region 21. The active region 21 is a region through which a main current (drift current) flows when the silicon carbide semiconductor device 10 is on. The active region 21, for example, is provided in substantially a center of the semiconductor substrate 1.

The edge termination region 22 is a region between the active region 21 and an end of the semiconductor substrate 1 and has a function of mitigating electric field of a front side of the semiconductor substrate 1 and sustaining breakdown voltage. The breakdown voltage is a voltage limit at which no malfunction or destruction of the silicon carbide semiconductor device 10 occurs. In the edge termination region 22, a voltage withstanding structure (not depicted) such as a field limiting ring (FLR), a junction termination extension (JTE) structure, etc. is disposed.

In the active region 21, at the front surface of the semiconductor substrate 1, one or more (herein, two) of the AlSi electrodes 4 are provided. FIG. 1 depicts an instance in which the silicon carbide semiconductor device 10 according to the embodiment is assumed to be a metal oxide semiconductor field effect transistor (MOSFET) with a three-layer structure including a metal, an oxide film, and a semiconductor, where the AlSi electrode 4 functioning as a source electrode 4a, and the AlSi electrode 4 functioning as a gate pad 4b are disposed. Configuration of the AlSi electrodes 4 is described hereinafter.

In a front side of the semiconductor substrate 1, a general trench gate structure (not depicted) is provided as the device structure of the silicon carbide semiconductor device 10. An interlayer insulating film 2 is provided in an entire area of the front surface of the semiconductor substrate 1. The interlayer insulating film 2, for example, is formed by sequentially stacking NSG and BPSG in the order stated. In the interlayer insulating film 2, a contact hole forming a contact (electrical contact portion) between the AlSi electrode 4 and the semiconductor substrate 1 is selectively provided. In FIG. 2, one contact hole in the interlayer insulating film 2 is depicted. A barrier metal 3 may be provided on the surface of the interlayer insulating film 2 and between the AlSi electrode 4 and the front surface of the semiconductor substrate 1 exposed in the contact hole of the interlayer insulating film 2.

The barrier metal 3 prevents diffusion of metal atoms to the semiconductor substrate 1 and interaction between adjacent regions facing each other across the barrier metal 3. The diffusion of aluminum atoms from the AlSi electrode 4 to the interlayer insulating film 2 is suppressed by the barrier metal 3. The barrier metal 3, for example, is a titanium (Ti) film, or a titanium nitride (TiN) film, or a stacked metal film in which a Ti film and a TiN film are stacked sequentially the order state herein. Between the barrier metal 3 (in an instance in which the barrier metal 3 is omitted, the AlSi electrode 4) and the semiconductor substrate 1, a silicide film 6 in ohmic contact with the semiconductor substrate 1 may be provided.

The source electrode 4a is electrically connected to the front surface of the semiconductor substrate 1 via the barrier metal 3 and the silicide film 6 or via the silicide film 6 alone and thereby is electrically connected to n$^+$-type source regions and p$^{++}$-type contact regions exposed at the front surface of the semiconductor substrate 1. The source electrode 4a, in the active region 21, covers substantially an entire area of the surface of a region excluding a region in which the gate pad 4b is disposed. A portion of the source electrode 4a exposed in the opening 5a of the later-described passivation film 5 functions as a source pad (electrode pad).

The gate pad (electrode pad) 4b, for example, is formed concurrently with the source electrode 4a, at the same level as the source electrode 4a, and is disposed apart from the source electrode 4a. The gate pad 4b is provided on the front surface of the semiconductor substrate 1 in the active region 21, via the interlayer insulating film 2, and is electrically insulated from the source electrode 4a by the interlayer insulating film 2. All gate electrodes (not depicted) of the MOSFET are electrically connected to the gate pad 4b via a gate runner 15 formed by a polysilicon (poly-Si) layer.

The gate runner 15 is disposed in the edge termination region 22 and surrounds the periphery of the active region 21. The gate runner 15 is provided on the front surface of the semiconductor substrate 1 via a field oxide film 14. The gate runner 15 is covered by the interlayer insulating film 2. The field oxide film 14 is provided between the front surface of the semiconductor substrate 1 and the interlayer insulating film 2, in an entire area of the edge termination region 22. The field oxide film 14, for example, is formed by an initial oxide (SiO$_2$) film and a high temperature oxide (HTO) film that are sequentially stacked in the order stated herein.

The field oxide film 14 and the gate runner 15 extend from the edge termination region 22, between the interlayer insulating film 2 and the front surface of the semiconductor substrate 1 directly beneath the gate pad 4b. In other words, in a formation region of the gate pad 4b, the field oxide film 14, the gate runner 15, the interlayer insulating film 2, the barrier metal 3, and the gate pad 4b are sequentially stacked on the front surface of the semiconductor substrate 1 in the order stated herein (refer to FIG. 2B). The gate pad 4b is exposed in the opening 5b of the passivation film 5.

The front surface of the semiconductor substrate 1 is covered by the passivation film 5. In the openings 5a, 5b of the passivation film 5, the AlSi electrodes 4 (the source electrode 4a and the gate pad 4b) are exposed, respectively. Each of the openings 5a, 5b of the passivation film 5 has a surface area that is smaller than that of the AlSi electrode 4 exposed by said opening 5a, 5b. Different bonding wires 11 are, respectively, bonded to the AlSi electrodes 4 exposed in the openings 5a, 5b of the passivation film 5 (in FIG. 1, the bonding wire 11 of the gate pad 4b are not depicted).

A first end of each of the bonding wires 11 is bonded to a corresponding one of the AlSi electrodes 4 while a second end thereof is bonded to a lead (not depicted) of a lead frame (later described mounting substrate 13). The bonding wires 11 are pressure bonded to surfaces of the AlSi electrodes 4 by ultrasonic welding and are crushed at bonded portions 11a thereof bonded to the AlSi electrodes 4. The AlSi electrodes 4 are crushed by the bonding wires 11 and a remaining thickness t2 thereof at a bonded portion 4c thereof bonded to the bonding wires 11 is thinner than a thickness (thickness at the time of deposition or after patterning (processing)) t1 of other portions thereof.

The bonding wires 11 are metal wires for leading out current flowing in the MOSFET, to an external destination. The bonding wires 11 contain aluminum as a material and have a general wire gauge (diameter, for example, in a range of about 100 μm to 400 μm). The wire gauge of the bonding wires 11 is suitably set according to the current capacity of the MOSFET, the surface area of the AlSi electrode 4, etc. and, for example, is about 300 μm or more. The bond between the bonding wires 11 and the AlSi electrodes 4 is a metal bond of dangling bonds of aluminum atoms.

A surface electrode 7 that functions as a drain electrode is provided in an entire area of a back surface of the semiconductor substrate 1. The surface electrode 7, for example, is bonded on a die pad of the mounting substrate 13, which is the lead frame, via the soldering layer 12, whereby the silicon carbide semiconductor device 10 is mounted to the front surface of the mounting substrate 13. The mounting substrate 13, for example, may be a direct copper bond (DCB) substrate in which a circuit pattern is formed by a conductive plate such as copper (Cu) foil, etc. on each surface of a ceramic substrate, for example.

Between the mounting substrate 13 on which is mounted the semiconductor substrate 1 to which the first ends of the bonding wires 11 are bonded and a lead (not depicted) to which the second ends of the bonding wires 11 are bonded, a thermosetting resin such as an epoxy resin is provided so as to cover the semiconductor substrate 1 and the bonding wires 11. In an instance in which a resin case (not depicted) is fixed to the edge of the mounting substrate 13, a sealing material such as an epoxy resin is filled between the resin case and the mounting substrate 13 so as to cover the semiconductor substrate 1 and the bonding wires 11.

Figure 3:
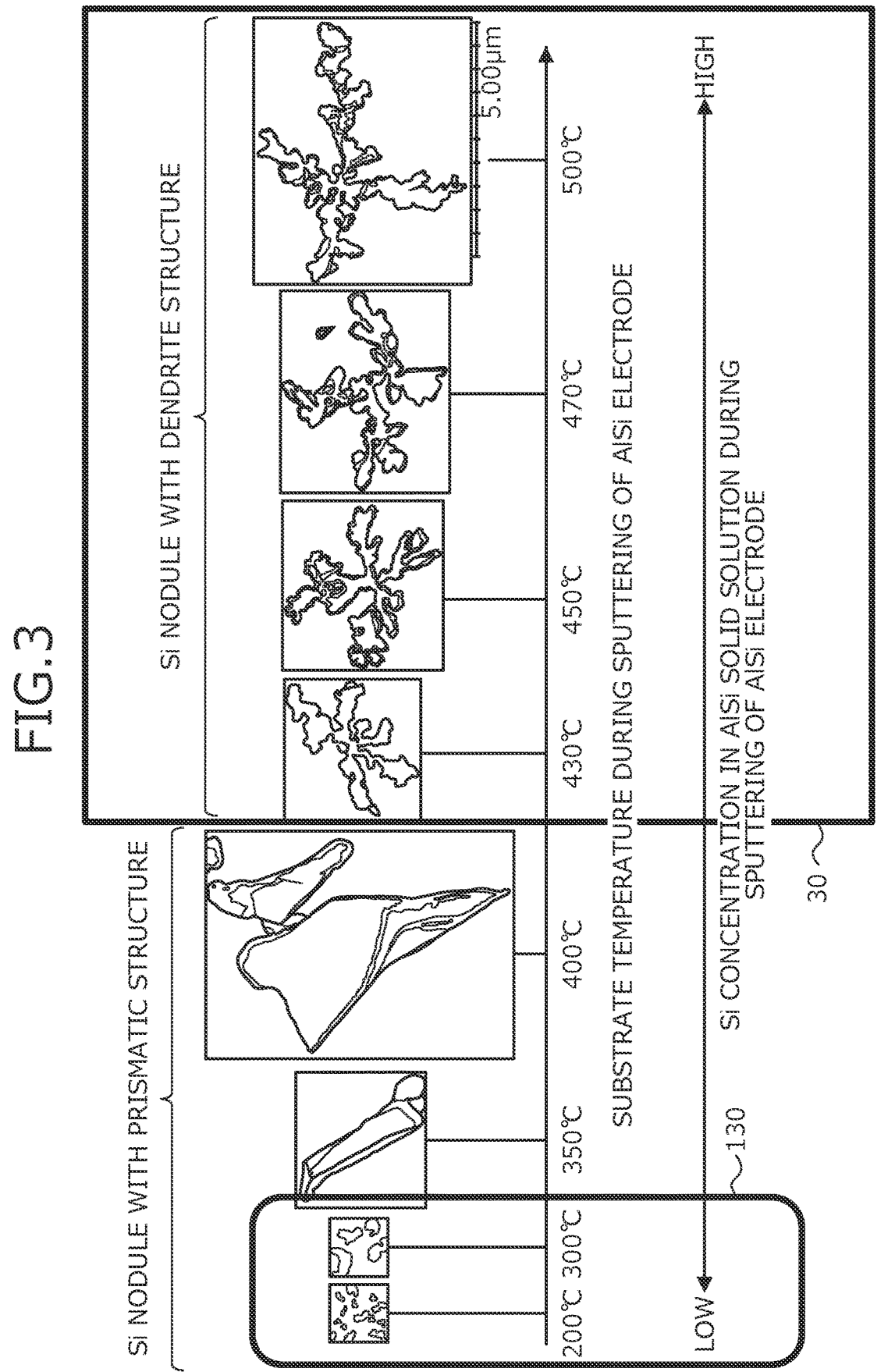
FIG. 3 is a diagram schematically depicting a relationship between sputtering temperature of an AlSi electrode and a crystal structure of the AlSi electrode.

Next, a configuration of the AlSi electrode 4 is described. FIG. 3 is a diagram schematically depicting a relationship between the sputtering temperature of the AlSi electrode and a crystal structure of the AlSi electrode. The AlSi electrode 4 is an AlSi solid solution deposited on the barrier metal 3 by sputtering under a state in which the temperature of the semiconductor substrate 1, or the temperature of a vicinity of a formation region of the AlSi electrode 4, or both (hereinafter, sputtering temperature) is a high temperature of about 430 degrees C. or higher but not more than about 577 degrees C. (solid phase curve temperature of the electrode material of the AlSi electrode 4).

The temperature of the semiconductor substrate 1 (substrate temperature) during sputtering of the AlSi electrode 4 depicted in FIG. 3 is the target sputtering temperature for the AlSi electrode 4. For samples for which the sputtering temperature is 350 degrees C. or less, the sputtering temperature is assumed to increase as number of semiconductor wafers successively processed increases in an instance in which the AlSi electrode 4 is deposited by low-temperature sputtering of a single wafer. Samples for which the sputtering temperature is 200 degrees C. and 350 degrees C. are assumed to be a first semiconductor wafer and sixth semiconductor wafer successively processed (similarly in FIGS. 4 to 6, 8, 9).

The embeddability of the AlSi electrode 4 is enhanced by increasing the sputtering temperature of the AlSi electrode 4. Further, raising the sputtering temperature of the AlSi electrode 4 enables solid solubility of silicon (silicon solid solubility limit concentration of AlSi solid solution) of the AlSi electrode 4 to be raised. Thus, silicon that exceeds the solid solubility of silicon in the AlSi electrode 4 and is molten in the AlSi electrode 4 forms the later-described Si nodule as the AlSi electrode 4 cools and the amount of precipitation in the AlSi electrode 4 may be reduced.

When the sputtering temperature of the AlSi electrode 4 exceeds 577 degrees C., during sputtering, the AlSi electrode 4 is partially (Si primary crystal+liquid phase, Al primary crystal+liquid phase) or entirely (liquid phase) converted to the liquid phase (refer to FIGS. 8A and 8B described hereinafter) and thereafter, during cooling to room temperature, the AlSi electrode 4 does not enter the solid phase (solidify). Further, when the sputtering temperature of the AlSi electrode 4 is too high (for example, 600 degrees C. or higher), sputtering equipment is damaged. When the sputtering temperature of the AlSi electrode 4 is less than 430 degrees C., during the subsequent wire bonding, a portion of the AlSi electrode 4 peels due to load, ultrasonic vibration, etc. applied to the AlSi electrode 4.

The solid solubility of silicon in the AlSi electrode 4 is determined according to the sputtering temperature. For example, assuming a sum of the aluminum concentration and the silicon concentration is 100 wt %, the solid solubility of silicon in the AlSi electrode 4 is about 0.3 wt % when the sputtering temperature is 430 degrees C. and is about 1.59 wt % when the sputtering temperature is 577 degrees C. (refer to later-described FIGS. 8A and 8B). In the present embodiment, the sputtering temperature is in a range of about 430 degrees C. to 577 degrees C. when the AlSi electrode 4 is deposited and thus, the solid solubility of silicon in the AlSi electrode 4 is in a range of about 0.3 wt % to 1.59 wt %.

The AlSi electrode 4 contains silicon and thus, interdiffusion of silicon atoms in the semiconductor substrate 1 and aluminum atoms in the AlSi electrode 4 is suppressed, whereby progression of alloy spikes is suppressed. Further, as the silicon concentration of the AlSi electrode 4 increases, the strength of the AlSi electrode 4 is enhanced. The AlSi electrode 4 may further contain copper (Cu) in a range of about 0.1 wt % to 5 wt % with respect to aluminum. When the AlSi electrode 4 contains copper, the strength of the AlSi electrode 4 is thereby enhanced. More preferably, the AlSi electrode 4 may contain copper in a range of about 0.5 wt % to 2 wt % with respect to aluminum.

The target composition (target concentration ratio of aluminum and silicon) of the AlSi electrode 4 may be suitably set. When the aluminum concentration of the AlSi electrode 4 is increased, a resistance value (conduction resistance) of the AlSi electrode 4 increases. The silicon concentration of the target composition of the AlSi electrode 4 is set to be higher than the solid solubility of silicon in the AlSi electrode 4, whereby Si nodules in the AlSi electrode 4 precipitate. In other words, the AlSi electrode 4 contains silicon (Si) nodules of an amount equivalent to the silicon concentration obtained by subtracting the solid solubility of silicon from the silicon concentration of the target composition. The Si nodules are silicon precipitate (Si crystal) grown from crystal grains having, as nuclei, silicon atoms that exceed the solid solubility of silicon in the AlSi electrode 4 and precipitate (recrystallize). The Si nodules precipitate substantially uniformly within a plane of the AlSi electrode 4, close to an interface with the barrier metal 3 in the AlSi electrode 4.

For example, the target composition of the AlSi electrode 4 is assumed to contain a silicon concentration of 1 wt % with respect to an aluminum concentration of 99 wt % and the sputtering temperature is assumed to be 430 degrees C. In this instance, the solid solubility of silicon is about 0.3 wt % and therefore, the AlSi electrode 4 contains Si nodules of an amount equivalent to the silicon concentration, which is about 0.7 wt % as obtained by subtracting 0.3 wt % from the silicon concentration of 1 wt % of the target composition. When the sputtering temperature is assumed to be 577 degrees C., the solid solubility of silicon is about 1.59 wt % in the AlSi electrode 4 and therefore, the silicon concentration of the target composition may be made greater than 1.59 wt %.

The AlSi electrode 4 contains Si nodules having a dendrite structure (dendrite: dendrite crystal). In general, during crystal growth, atoms are preferentially and easily incorporated in defective portions of the crystal surface. When the rate of crystal growth is relatively gradual, the crystal structure is free of unevenness at the crystal surface and has the same regular arrangement as that of a lower layer. On the other hand, when a solid precipitates from a supercooled or supersaturated liquid, dendrites are likely to occur. The reason for this is that when supercooled or supersaturated liquid is around the silicon atoms that form the nucleus (the nucleus constituting a seed of the crystal), adsorption of atoms to the crystal surface (recrystallization) proceeds rapidly at temperatures equal to or below the solid phase curve temperature.

Under a temperature equal to or below the solid phase curve temperature, the solid phase is in a stabilization phase and the state easily changes from the liquid phase to the solid phase. Therefore, atoms in the liquid phase not only fill the defective parts of the nuclear crystal, but also adsorb at various locations on the crystal surface regardless of the state of the crystal surface. Probabilistically, atoms are easily adsorbed at the tip (vertex) of a convex portion of the crystal surface and thus, the convex portion of the crystal surface is substantially orthogonal to the crystal surface, extends linearly, and is long. The tip of the convex part of the crystal surface branches off with the slightest trigger thereby changing the state like that of crystal growth of a snowflake and forming a dendrite structure with a certain regularity. The AlSi electrode 4 may contain a mixture of Si nodules with a dendrite structure and Si nodules with a structure other than a dendrite structure (non-dendrite structure).

In other words, a Si nodule with a dendrite structure is a silicon (Si) crystal generated by the rapid adsorption of atoms to the crystal surface in the process of changing from the liquid phase to the solid phase, and is grown from a crystal grain into a dendritic shape so as to extend tree-like branches substantially orthogonal to the crystal surface of the AlSi electrode 4 (direction orthogonal to the surface of the semiconductor substrate 1 and away from the surface of the semiconductor substrate 1). A Si nodule with a non-dendrite structure is a Si nodule having a prismatic structure and is grown from a crystal grain into a prismatic shape in the thickness direction of the AlSi electrode 4. To precipitate Si nodules having a dendrite structure in the AlSi electrode 4, the sputtering temperature of the AlSi electrode 4 suffices to be 430 degrees C. or higher (in FIG. 3, Si crystal surrounded by a rectangular frame 30).

For example, when silicon is used as a semiconductor material, as described above, the sputtering temperature of the AlSi electrode is less than 300 degrees C. and thus, the Si nodules in the AlSi electrode substantially all have a prismatic structure (in FIG. 3, Si crystal surrounded by a rectangular frame 130). Further, for example, when the sputtering temperature of the AlSi electrode is 400 degrees C. or less, the Si nodules in the AlSi electrode substantially all have a prismatic structure. Here, the height of Si nodules having a prismatic structure reaches at most about 5 μm in the thickness direction of the AlSi electrode 4.

On the other hand, when the sputtering temperature of the AlSi electrode 4 exceeds 400 degrees C., precipitate morphology of the Si nodules in the AlSi electrode 4 changes from a prismatic structure to a dendrite structure. Similar to the present embodiment, when the sputtering temperature of the AlSi electrode 4 is set to 430 degrees C. or higher, crystal of Si nodules having a dendrite structure grows while growth of Si nodules having a prismatic structure becomes difficult. Further, by setting the sputtering temperature of the AlSi electrode 4 to 577 degrees C. or less, during sputtering of the AlSi electrode 4, conversion of Si nodules to the liquid phase may be prevented.

Further, when the sputtering temperature of the AlSi electrode 4 is raised, the number (area amount) of the Si nodules having a dendrite structure in the AlSi electrode 4 increases while the number of Si nodules having a prismatic structure in the AlSi electrode 4 decreases (refer to FIG. 6). Further, when the sputtering temperature of the AlSi electrode 4 is raised, the area of individual Si nodules increases because the Si nodules branch finely at narrow intervals and grow in a horizontal direction parallel to the crystal surface and thus, while the area of individual Si nodules increases, the number of Si nodules decreases when the sputtering temperature of the AlSi electrode 4 is raised and thus, the total area of the Si nodules decreases.

The area amount of the Si nodules having a dendrite structure in the AlSi electrode 4, preferably, for example, may be at least, in the bonded portion 4c where each of the bonding wires 11 is bonded, 10% or greater of the total surface area of the Si nodules in the bonded portion 4c. Through the earnest research by the inventors, it was confirmed that to precipitate the Si nodules having a dendrite structure in the AlSi electrode 4 at the area amount, the sputtering temperature of the AlSi electrode 4 suffices to be set to 430 degrees C. or higher (refer to FIG. 6). The area of the Si nodules is the area (surface area) of a planar shape of the Si nodules when viewed from the front side of the semiconductor substrate 1.

Figure 4:
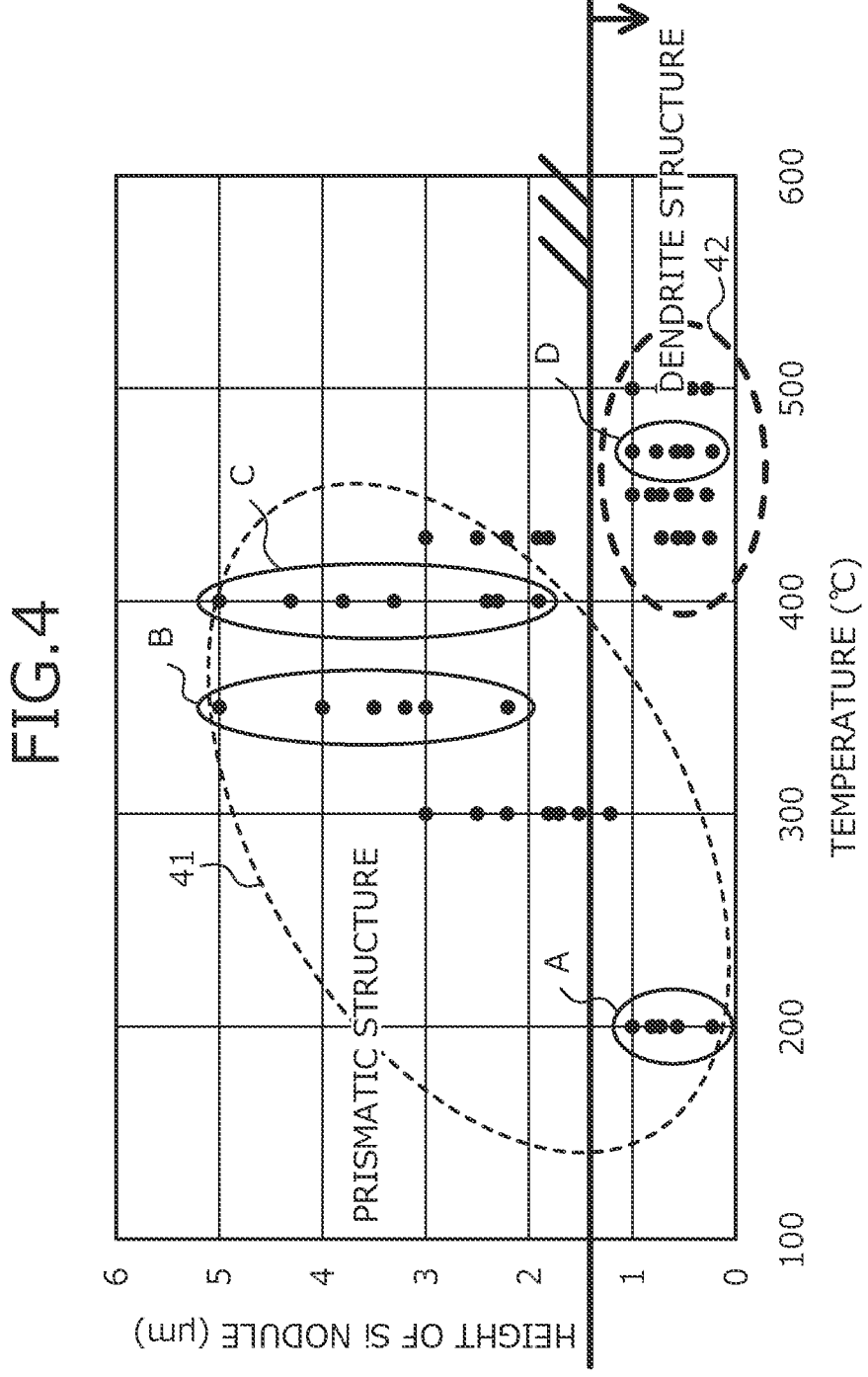
FIG. 4 is a characteristics diagram depicting a relationship between the sputtering temperature of the AlSi electrode and a height of Si nodules in the AlSi electrode in a first experimental example.

The height (height in the thickness direction of the AlSi electrode 4) of the Si nodules in the AlSi electrode 4, in Si nodules having a dendrite structure and in those having a prismatic structure, is about 2 μm or less, that is, less than the remaining thickness t2 of the AlSi electrode 4 (refer to FIGS. 4 to 6). A reason for this is that, as described above, during sputtering of the AlSi electrode 4, the Si nodules change from a prismatic structure to a dendrite structure, whereby in addition to the growth of Si nodules having a prismatic structure becoming difficult, the Si nodules having a dendrite structure grow in a horizontal direction parallel to the crystal surface and growth in the thickness direction is difficult.

When the sputtering temperature of the AlSi electrode 4 is raised, crystal growth of Si nodules having a dendrite structure becomes dominant and Si nodules having a prismatic structure do not grow more than 2 μm. Further, when the sputtering temperature of the AlSi electrode 4 is raised, the Si nodules branch finely at narrow intervals and grow in a horizontal direction parallel to the crystal surface and thus, the height of the Si nodules having a dendrite structure is further reduced and, for example, is 1 μm or less. Accordingly, the height of Si nodules in the AlSi electrode 4, in the Si nodules having a dendrite structure and those having a prismatic structure, is about 2 μm or less.

An upper limit of the thickness t1 of the AlSi electrodes 4 is a limit of the thickness due to deposition accuracy of the sputtering equipment or processing capability of dry etching equipment and, for example, is about 5 μm. Preferably, the thickness t1 of the AlSi electrodes 4 may be as thick as possible and when the thickness t1 of the AlSi electrodes 4 is increased, conduction loss may be reduced. As described above, the bonding wire 11 is pressure bonded to the AlSi electrode 4, whereby, in the AlSi electrode 4, the remaining thickness t2 at the bonded portion 4c thereof where the bonding wire 11 is bonded is, for example, about 2.1 μm at a thinnest portion (refer to FIG. 7).

Next, a method of manufacturing the silicon carbide semiconductor device 10 according to the embodiment is described with reference to FIGS. 1, 2A, and 2B. First, after dicing (cutting) of the semiconductor wafer that contains silicon carbide, a predetermined device structure (not depicted) is formed at the front side of a region constituting the semiconductor chip (the semiconductor substrate 1). For example, when the silicon carbide semiconductor device 10 according to the embodiment is an n-channel-type vertical MOSFET, the predetermined device structure is an insulated gate structure formed by a p-type base region, the $n^+$-type source regions, the $p^{++}$-type contact regions, gate insulating films, and the gate electrodes.

Next, the field oxide film 14 is formed at the front surface of the semiconductor wafer and a polysilicon layer constituting the gate runner 15 is formed on the field oxide film 14. The gate runner 15 may be formed concurrently with the gate electrodes configuring the insulated gate structure. Next, the interlayer insulating film 2 is formed in an entire area of the front surface of the semiconductor wafer and the interlayer insulating film 2 covers the gate electrodes and the gate runner 15 (refer to FIGS. 2A and 2B). Next, the interlayer insulating film 2 is selectively removed, thereby forming contact holes at predetermined locations in the interlayer insulating film 2.

Next, the silicide film 6 that is in ohmic contact with portions (the $n^+$-type source regions and the $p^{++}$-type contact regions in the active region 21) of the front surface of the semiconductor wafer exposed in the contact holes of the interlayer insulating film 2 is formed. Next, the barrier metal 3 is formed at the surface of the interlayer insulating film 2 and the surface of the silicide film 6. In an instance in which the barrier metal 3 is a stacked metal film, before formation of the silicide film 6, the surface of the interlayer insulating film 2 alone may be covered and protected by a lower layer metal film (for example, TiN film) of the barrier metal 3 and in this state, the silicide film 6 may be formed.

Next, the semiconductor wafer is placed on a stage of general sputtering equipment (not depicted), with the back surface of the semiconductor wafer facing the stage and, for example, being held on the stage by an electric static chuck (ESC) or the like. Next, for example, a chamber (processing furnace) of the sputtering equipment or the stage thereof is heated by a heating means such as a heater, whereby the temperature of the semiconductor wafer or the temperature of a vicinity of the formation regions of the AlSi electrode 4 (i.e., sputtering temperature) is increased to be in a range of about 430 degrees C. to 577 degrees C. The sputtering temperature of the AlSi electrode 4 may fluctuate provided fluctuation is within this temperature range.

The AlSi electrode 4 is deposited (formed) on the barrier metal 3 by sputtering at this sputtering temperature (deposition process). As described above, in the AlSi electrode 4, to precipitate Si nodules of an amount equivalent to the silicon concentration obtained by subtracting the solid solubility of silicon, which is dependent on the sputtering temperature, from the silicon concentration of the target composition, the target composition of the AlSi electrode 4 is suitably set according to the sputtering temperature. Next, the semiconductor wafer is cooled to room temperature (for example, about 25 degrees C.), (for example, in a case of Al+1 wt % Si, cooling is by a cooling rate in a range of 50 degrees C./second to 300 degrees C./second; in a case of Al+0.5 wt % Si, cooling is by a cooling rate in a range of 50 degrees C./second to 200 degrees C./second; and in a case of Al+1.5 wt % Si or when the amount of contained Si is higher, cooling is at a cooling rate in a range of 50 degrees C./second to 500 degrees C./second). As described, the rapid cooling takes advantage of a phenomenon of rapid recrystallization and dendrite formation due to crystal growth during supercooling, whereby the AlSi electrode 4 is formed containing Si nodules having a dendrite structure. Herein, Al+n[wt %]Si (where, n is an integer) means the AlSi electrode 4 of a Si content rate of n[wt %].

Further, in the AlSi electrode 4, the height of Si nodules having a dendrite structure and those having a prismatic structure is about 2 μm or less and the Si nodules having a dendrite structure meet the area amount described above. Next, the AlSi electrode 4 is etched (patterned) using general dry etching equipment, whereby predetermined locations are left. The AlSi electrodes 4 left at the predetermined locations after the patterning correspond to the source electrode 4a and the gate pad 4b. Next, a device structure is formed at the back side of the semiconductor wafer and the surface electrode 7 is formed at the back surface of the semiconductor wafer.

Next, the semiconductor wafer is diced into individual chips (the semiconductor substrate 1), whereby the silicon carbide semiconductor device 10 according to the embodiment depicted in FIGS. 1, 2A, and 2B is completed. Next, the surface electrode 7 of the semiconductor substrate 1 is bonded, via the soldering layer 12, on, for example, the die pad of the mounting substrate 13, which is the lead frame, or a wiring layer constituting a lead, whereby the silicon carbide semiconductor device 10 is mounted on the front surface of the mounting substrate 13. Next, by a general wire bonding process, the bonding wires 11 are pressure bonded to each of the AlSi electrodes 4 of the semiconductor substrate 1.

In the general wire bonding process, the bonding wires 11 are pressed to the AlSi electrode 4 while being subjected to vibration generated by ultrasonic waves, whereby at bonding locations of the bonding wires 11, a natural oxide film of the surfaces of the AlSi electrodes 4 is removed, thereby exposing the surface of the AlSi electrodes 4 in an active state (dangling bonds of aluminum atoms). Further, dangling bonds of the aluminum atoms of the bonding wires 11 and those of the AlSi electrode 4 are metallically bonded, whereby the bonding wires 11 are bonded to the surfaces of the AlSi electrodes 4.

At this time, while the remaining thickness t2 of the bonded portion 4c of the AlSi electrode 4 where the bonding wire 11 is bonded becomes thinner than the thickness t1 of other portions of the AlSi electrode 4 and is, for example, about 2.1 μm and peeling of the AlSi electrode 4 during wire bonding does not occur. A reason for this is that, by the conditions described above (the height, the area amount), the AlSi electrodes 4 contain the Si nodules having a dendrite structure, whereby even when the bonding wires 11 are pressed to the AlSi electrodes 4, Si nodules in the AlSi electrode 4 do not damage layers below. In this manner, a semiconductor package in which the silicon carbide semiconductor device 10 is mounted is completed.

A relationship between the sputtering temperature of the AlSi electrode 4, the height, and the area amount of the Si nodules was verified. FIG. 4 is a characteristics diagram depicting a relationship between the sputtering temperature of the AlSi electrode and the height of the Si nodules in the AlSi electrode in a first experimental example. FIGS. 5A, 5B, 5C, and 5D are plan views schematically depicting states when the Si nodules of samples A, B, C, and D in FIG. 4 are viewed from the front side of the semiconductor substrate. FIG. 6 is a table depicting a relationship between the sputtering temperature of the AlSi electrode and the area amount of the Si nodules in the AlSi electrode in the first experimental example.

Multiple samples were prepared in which AlSi electrodes having a thickness of 5 μm were deposited by sputtering on a semiconductor substrate (semiconductor chip) containing silicon carbide (hereinafter, the first experimental example). Multiple samples were fabricated for each sputtering temperature by variously changing the sputtering temperature of the AlSi electrode. The Si nodules in the AlSi electrodes of all the samples were exposed by wet etching using a mixture of phosphate (H$_3$PO$_4$), nitric acid (HNO$_3$), and acetic acid (CH$_3$COOH), dimensions of the Si nodules and the height of the Si nodules (height in the thickness direction of the AlSi electrodes) were measured from the front side of the semiconductor substrate.

The relationship between the sputtering temperature of the AlSi electrode and the height of the Si nodules in the AlSi electrode in the first experimental example is depicted in FIG. 4. States of the Si nodules in the AlSi electrodes of the samples A to D of the first experimental example, for which the sputtering temperatures of the AlSi electrodes were 200 degrees C., 350 degrees C., 400 degrees C., and 470 degrees C., respectively, observed by a scanning electron microscope (SEM) from the front side of the semiconductor substrate are depicted schematically in FIGS. 5A to 5D, respectively.

Calculated results of the area amount of the Si nodules of the AlSi electrodes of the first experimental example are shown in FIG. 6. FIG. 6 shows the sputtering temperature of the AlSi electrode (temperature of the semiconductor substrate during deposition of the AlSi electrodes), the precipitate morphology (prismatic shape, dendrite shape) of the Si nodules in the AlSi electrodes, the area amount and the height of the Si nodules having a prismatic structure in the AlSi electrodes (in FIG. 6, indicated as prism percentage and prism height, respectively), the area amount and the height of the Si nodules having a dendrite structure in the AlSi electrodes (in FIG. 6, indicated as dendrite percentage and dendrite height, respectively), and whether peeling of the bonding wire occurred (yes, no).

Figure 5A:
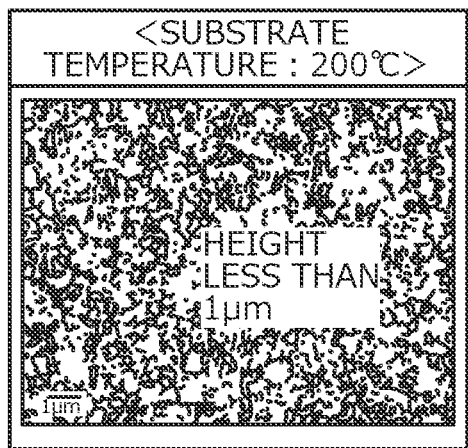
FIG. 5A is a plan view schematically depicting a state when the Si nodules of sample in FIG. 4 is viewed from a front side of the semiconductor substrate.
Figure 5B:
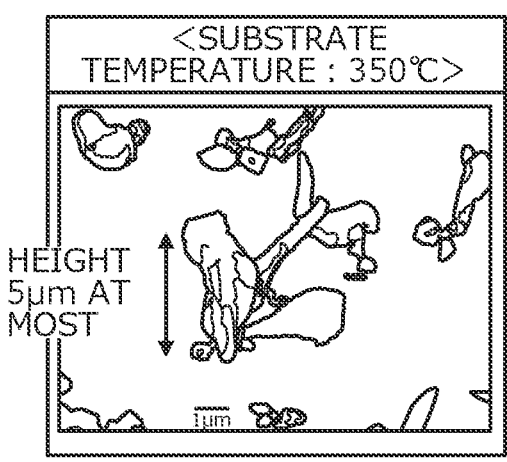
FIG. 5B is a plan view schematically depicting a state when the Si nodules of sample B in FIG. 4 is viewed from the front side of the semiconductor substrate.
Figure 5C:
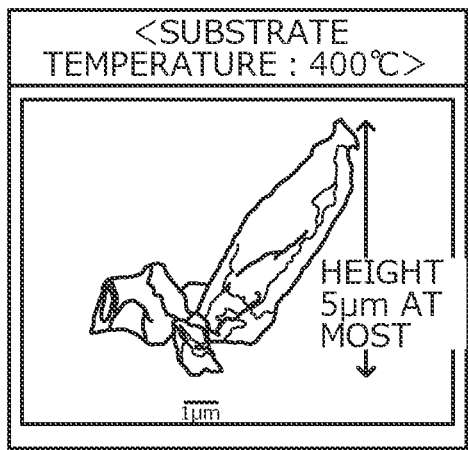
FIG. 5C is a plan view schematically depicting a state when the Si nodules of sample C in FIG. 4 is viewed from the front side of the semiconductor substrate.
Figure 5D:
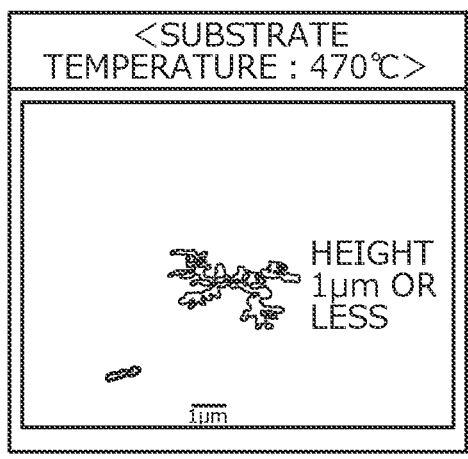
FIG. 5D is a plan view schematically depicting a state when the Si nodules of sample D in FIG. 4 is viewed from the front side of the semiconductor substrate.

From the results shown in FIGS. 4 to 6, it was confirmed that when the sputtering temperature of the AlSi electrode is 400 degrees C. or less, the Si nodules in the AlSi electrodes all have a prismatic structure (in FIG. 4, portion surrounded by frame 41, for a prism percentage of 100%, refer to FIGS. 5A to 5C). Further, it was confirmed that when the sputtering temperature of the AlSi electrodes is in a range of 350 degrees C. to 400 degrees C., the bonding wires bonded to the AlSi electrodes peeled (in FIG. 6, peeling of bonding wire "YES"). Here, it was confirmed that the height of the Si nodules having a prismatic structure reached a maximum of 5 μm (refer to FIGS. 5B and 5C).

It was confirmed that when the sputtering temperature of the AlSi electrode exceeds 400 degrees C., the AlSi electrodes contain a mixture of Si nodules having the prismatic structure and those having a dendrite structure; however, when the sputtering temperature of the AlSi electrode is less than 430 degrees C., during wire bonding, at contact portions with the bonding wire, the AlSi electrodes peeled off and the bonding wire peeled (bonding wire could not be bonded). It was confirmed that the area amount (dendrite percentage) of the Si nodules having a dendrite structure in the AlSi electrodes at this time was less than 10% while the height (prism height) of the Si nodules having a prismatic structure exceeded 2 μm (refer to FIG. 6).

It was confirmed that when the sputtering temperature of the AlSi electrode was less than 300 degrees C., the Si nodules in the AlSi electrodes all has a prismatic structure; however, the height of the Si nodules having a prismatic structure was 1 μm or less (refer to FIGS. 4 and 5A, not depicted in FIG. 6). It was confirmed that while peeling of the bonding wires bonded to the AlSi electrodes did not occur, the AlSi electrodes cannot be embedded in the contact holes by sputtering when the aspect ratio of the contact holes of the interlayer insulating film is large.

On the other hand, it was confirmed that when the sputtering temperature of the AlSi electrode is 430 degrees C. or higher (in FIG. 4, portion surrounded by frame 42), the bonding wires bonded to the AlSi electrodes did not peel (in FIG. 6, peeling of bonding wire "NO"). It was confirmed that the area amount (dendrite percentage) and the height (dendrite height) of the Si nodules having a dendrite structure in the AlSi electrodes at this time was at least 10% and not more than 1 μm, respectively and the height (prism height) of the Si nodules having a prismatic structure was at most 2 μm.

In other words, in FIG. 6, the AlSi electrodes of the samples for which the sputtering temperature of the AlSi electrodes was about 430 degrees C. or higher correspond to the AlSi electrodes 4 of the present embodiment. In FIG. 6, while, the prismatic structure (prism percentage) and the dendrite structure (dendrite percentage) are shown as the area amount of the Si nodules and the percentage of the total area of Si nodules with respect to the area (surface area) of the overall area of the surface of the AlSi electrode is shown, similar results are obtained in an instance of the area amount of the Si nodules relative to the area of a portion (for example, a contact portion in contact with the bonding wire) of the AlSi electrode.

Further, it was confirmed that setting the sputtering temperature of the AlSi electrode to 430 degrees C. or higher enables embedding of the AlSi electrode in the contact holes by sputtering even when the aspect ratio of the contact holes of the interlayer insulating film is large. Thus, it was confirmed that setting the sputtering temperature of the AlSi electrode to 430 degrees C. or higher enables enhancement of the embeddability of the AlSi electrodes by sputtering and prevention of peeling of the bonding wire.

Figure 7:
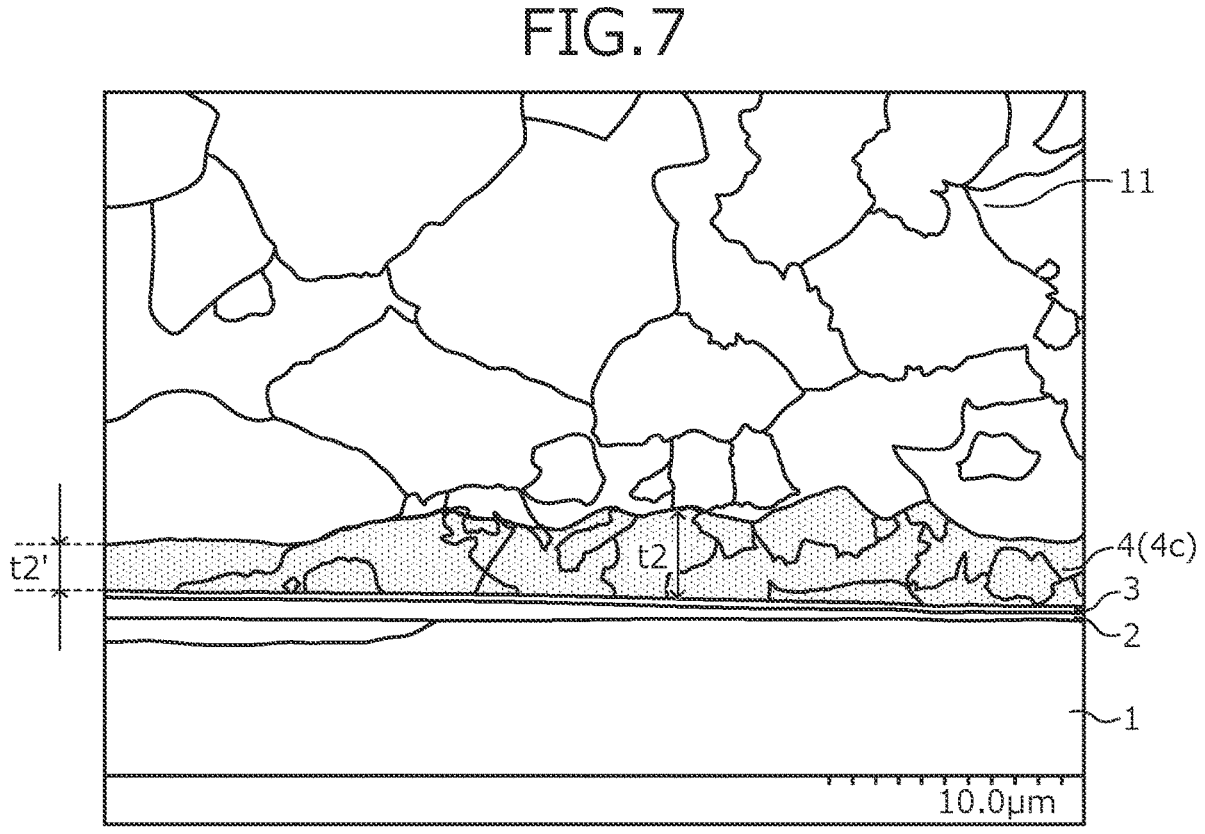
FIG. 7 is a cross-sectional view schematically depicting a bonded portion where a bonding wire is bonded to the AlSi electrode in a second experimental example.

The remaining thickness t2 at the bonded portions 4c of the AlSi electrodes 4 where the bonding wires 11 are bonded was verified. FIG. 7 is a cross-sectional view schematically depicting a bonded portion where the bonding wire is bonded to the AlSi electrode in a second experimental example. According to the method of manufacturing the silicon carbide semiconductor device 10 according to the embodiment described above, a sample was prepared in which the AlSi electrode 4 having the thickness t1 of 5 μm is deposited on the semiconductor substrate 1 by sputtering and the bonding wire 11 containing aluminum is bonded to the AlSi electrode 4 by wire bonding (hereinafter, the second experimental example).

FIG. 7 schematically depicts a state of the bonded portion 4c of the AlSi electrode 4 (hatched portion) where the bonding wire 11 is bonded in the sample, observed by a SEM from a direction parallel to the front surface of the semiconductor substrate 1. From the results depicted in FIG. 7, it was confirmed that the AlSi electrode 4 is crushed by the bonding wires 11 and a portion of the bonded portion 4c where the bonding wire 11 is bonded and the remaining thickness t2 is thinnest, has a thickness t2' of about 2.1 μm, which is about a half of the thickness (thickness during deposition or after patterning (processing)) t1 of other portions of the AlSi electrode 4.

Figure 8A:
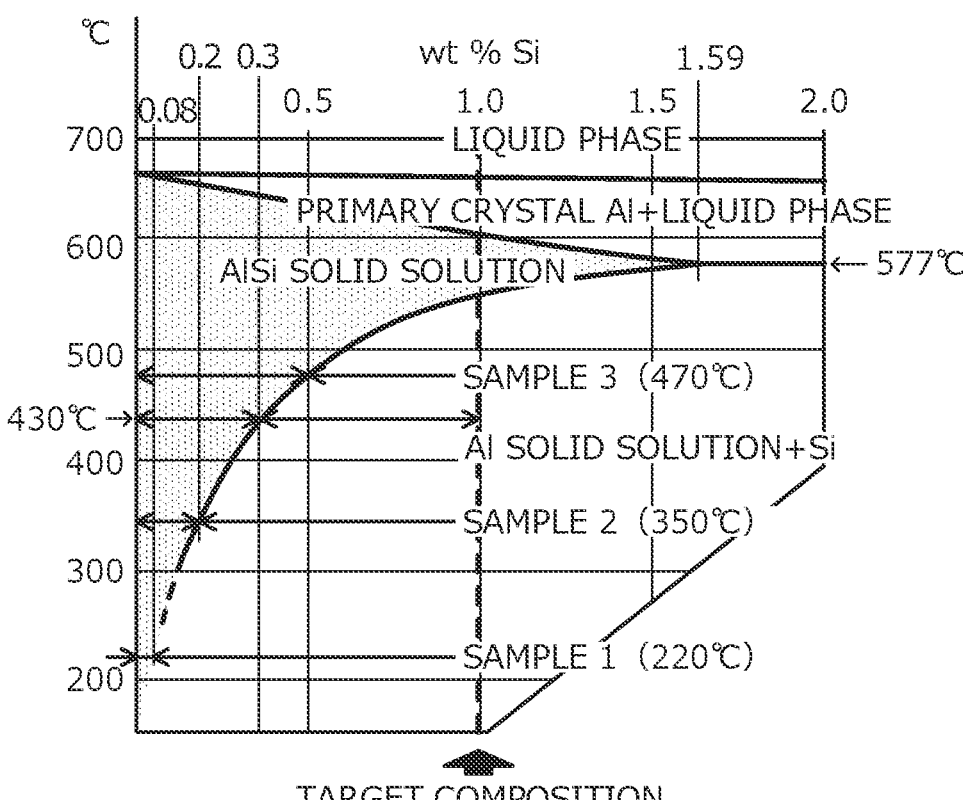
FIG. 8A is a characteristics diagram depicting an equilibrium state diagram for an AlSi alloy.
Figure 8B:
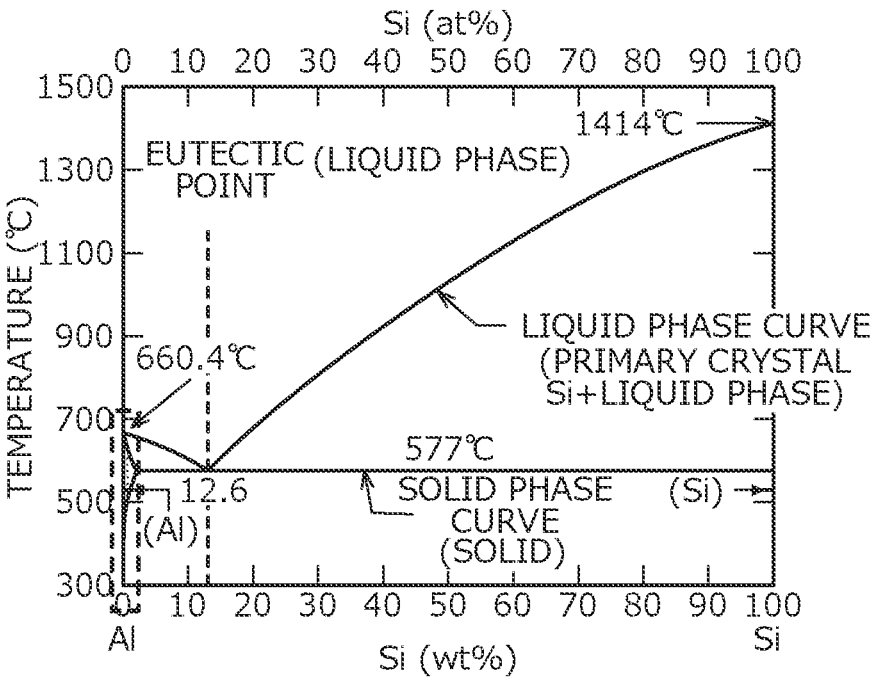
FIG. 8B is a characteristics diagram depicting the equilibrium state diagram for the AlSi alloy.

A relationship between the sputtering temperature of the AlSi electrode 4 and the silicon concentration is described. FIGS. 8A and 8B are characteristics diagrams depicting an equilibrium state diagram for an AlSi alloy. FIG. 8A is an enlarged view of a range 0.0 wt % to 2.0 wt % of the silicon concentration in FIG. 8B (surrounded by a dashed line in FIG. 8B). FIG. 8B depicts the equilibrium state diagram of the AlSi alloy that is a material of the AlSi electrode 4. In FIG. 8B, a left-end of a horizontal axis is the aluminum concentration 100.0 wt % and the silicon concentration 0.0 wt %; in a direction to a right end, the aluminum concentration decreases and the silicon concentration increases; and the right end is the aluminum concentration 0.0 wt % and the silicon concentration 100.0 wt %. In FIG. 8B, a vertical axis corresponds to the sputtering temperature.

As depicted in FIG. 8B, the equilibrium state diagram of the AlSi alloy has a eutectic point at the silicon concentration 12.6 wt % and the solid phase curve temperature 577 degrees C., eutectic solidification of changing from the liquid phase to the solid phase (solid) that is AlSi solid solution (Al phase)+Si phase is performed. The solid solubility of silicon in the AlSi solid solution (hatched portion) increases as the temperature increases, for example, is 0.3 wt % at a temperature of 430 degrees C., and at the solid phase curve temperature, is a maximum value (maximum silicon solid solution) of 1.59 wt %. Thus, from the equilibrium state diagram of FIGS. 8A and 8B, it is expected that by setting the sputtering temperature of the AlSi electrode 4 in a range of about 430 degrees C. to 577 degrees C., the solid solubility of silicon in the AlSi electrode 4 becomes within a range of 0.3 wt % to 1.59 wt %.

Further, as depicted in FIG. 8B, substantially no aluminum solid solution is in the silicon, and when the silicon concentration of the target composition of the AlSi alloy exceeds the solid solubility of silicon in the AlSi solid solution, the Si phase (Si nodule) precipitates. For example, for samples 1, 2, and 3 depicted in FIG. 8A, the solid solubility of silicon in the AlSi solid solution and the silicon concentration of the Si phase in instances in which the AlSi electrode 4 is formed by sputtering temperatures 220 degrees C., 350 degrees C., and 470 degrees C. are indicated by double-headed arrows. In sample 1, the solid solubility of silicon (range indicated by double-headed arrow in hatching) of the AlSi solid solution is 0.08 wt % and the silicon concentration (range indicated by double-headed arrow between the solid phase curve and a dashed vertical line indicating the silicon concentration of the target composition) of the Si phase is 0.92 wt %.

In sample 2, the solid solubility of silicon in the AlSi solid solution is 0.2 wt % and the silicon concentration of the Si phase is 0.8 wt %. In sample 3, the solid solubility of silicon in the AlSi solid solution is 0.5 wt % and the silicon concentration of the Si phase is 0.5 wt %. In other words, the Si phase of an amount equivalent to the silicon concentration obtained by subtracting the solid solubility of silicon in the AlSi solid solution from the silicon concentration (=1.0 wt %) of the target composition precipitates. Thus, from the equilibrium state diagram in FIGS. 8A and 8B, it is expected that the AlSi electrode 4 is a AlSi solid solution having a solid solubility of silicon, which is dependent on the sputtering temperature, and contains Si nodules of an amount equivalent to the silicon concentration obtained by subtracting the solid solubility of silicon from the silicon concentration of the target composition.

Figure 9:
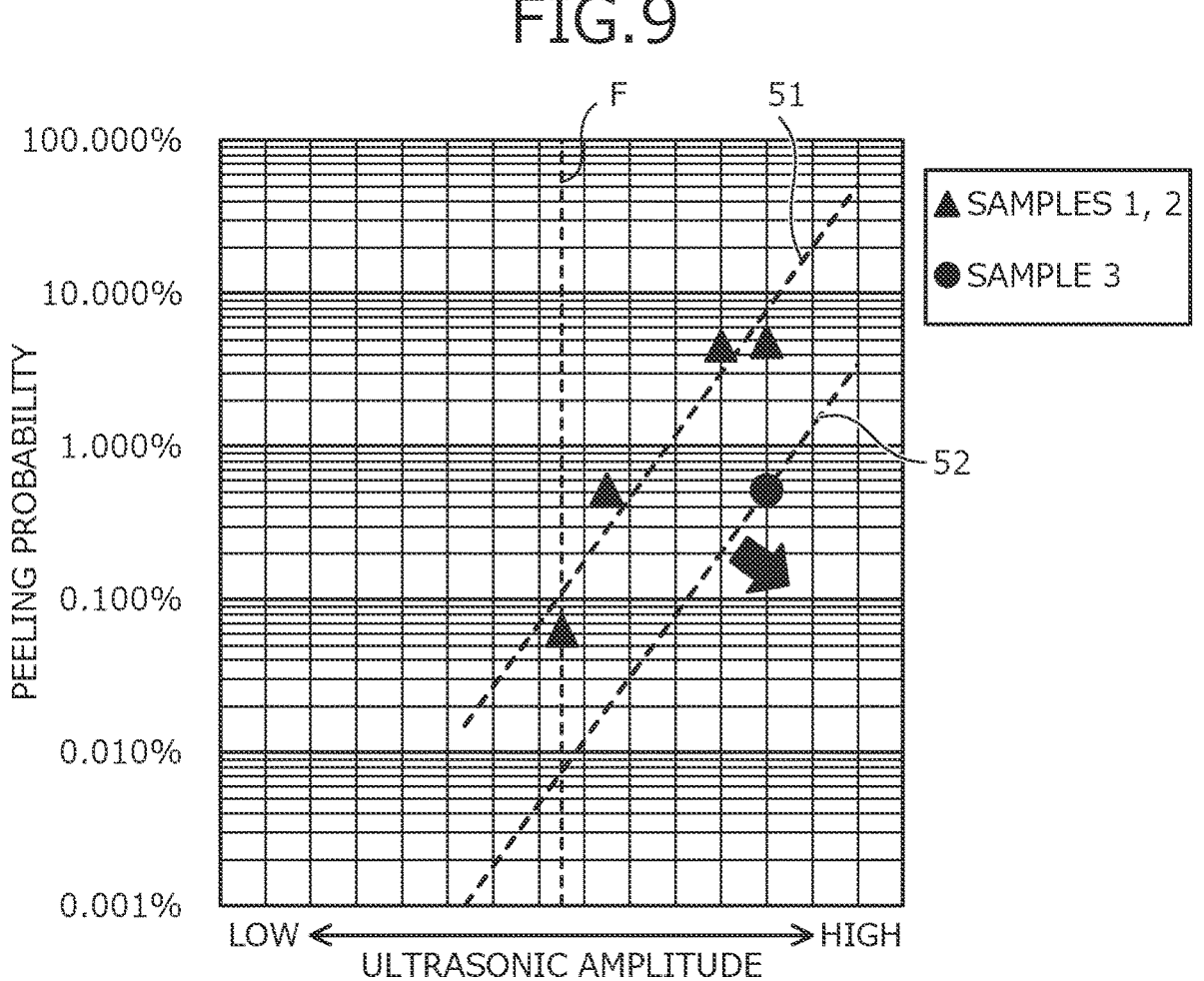
FIG. 9 is a characteristics diagram depicting peeling probability of the AlSi electrode during wire bonding in a fourth experimental example.

A relationship between the sputtering temperature of the AlSi electrode 4 and the peeling probability of the AlSi electrode 4 during wire bonding was verified. FIG. 9 is a characteristics diagram depicting peeling probability of the AlSi electrode during wire bonding in a fourth experimental example. In FIG. 9, a horizontal axis represents amplitude of ultrasonic vibration received by the AlSi electrode 4 from the bonding wires 11; in a direction toward the right end, the ultrasonic vibration received by the AlSi electrode 4 increases. In FIG. 9, a vertical axis represents the peeling probability of the AlSi electrode 4 during wire bonding and is a reciprocal of the total number of verified semiconductor chips (the semiconductor substrate 1) in which a portion of the AlSi electrode 4 peeled (hereinafter, peeling of the AlSi electrode 4) at the contact portion between the bonding wire 11 and the AlSi electrode 4.

According to the method of manufacturing the semiconductor device according to the embodiment described above, samples were fabricated for which the target sputtering temperature for the AlSi electrode 4 was 300 degrees C. and 470 degrees C. For each of these samples, results of an approximately linear curve of the probability of peeling of the AlSi electrode 4 during wire bonding was obtained from the number of semiconductor chips in which peeling of the AlSi electrode 4 occurred during wire bonding in an assembly process are depicted in FIG. 9. It was assumed that for the samples for which the target sputtering temperature for the AlSi electrode 4 was 300 degrees C. and 470 degrees C., the slopes of approximately linear curves 51, 52 of the probability of peeling of the AlSi electrode 4 during wire bonding were the same.

The samples (in FIG. 9, symbol "▲") for which the target sputtering temperature for the AlSi electrode 4 was 300 degrees C. are samples in which the sputtering temperature fluctuated in a range of 200 degrees C. to 350 degrees C. and correspond to samples 1 and 2 in FIGS. 8A and 8B. It was assumed that of the measurement points of samples 1 and 2, a measurement point set as a predetermined amplitude F for ultrasonic vibration during wire bonding confirmed that no peeling of the AlSi electrode 4 occurred in 1600 semiconductor chips and that in a 1601st semiconductor chip, the AlSi electrode 4 peeled. In other words, the probability of peeling of the AlSi electrode 4 at the measurement point is 0.0625% ($=\frac{1}{1601}$).

The probability of peeling of the AlSi electrode 4 being 0.0625% means that in the assembly process, the probability of a module being defective due to wire bonding to the AlSi electrode 4 of the semiconductor chip is 2% (i.e., a defective module occurs at a probability of 1/50 modules). For other measurement points where the amplitude of the ultrasonic vibration during wire bonding is different from that for samples 1 and 2, similarly, the number of semiconductor chips free of peeling of the AlSi electrode 4 was confirmed and the probability of peeling of the AlSi electrode 4 was calculated. From multiple measurement points of samples 1 and 2, the approximately linear curve 51 of the probability of peeling of the AlSi electrode 4 during wire bonding of samples 1 and 2 was calculated.

A sample (in FIG. 9, symbol "●") for which the target sputtering temperature for the AlSi electrode 4 was 470 degrees C. corresponds to sample 3, for which the sputtering temperature was maintained at 470 degrees C., in FIGS. 8A and 8B. It was assumed that the measurement point of sample 3 was a 192nd semiconductor chip and no peeling of the AlSi electrode 4 occurred and in a 193rd semiconductor chip, the AlSi electrode 4 peeled. In other words, the probability of peeling of the AlSi electrode 4 at the measurement point is 0.52% ($=\frac{1}{193}$). As per the measurement point of sample 3, a linear curve parallel to the approximately linear curve 51 of the probability of peeling of the AlSi electrode 4 for samples 1 and 2 was set as the approximately linear curve 52 of the probability of peeling of the AlSi electrode 4 for sample 3.

The ultrasonic vibration during wire bonding calculated based on the approximately linear curve 52 of the probability of peeling of the AlSi electrode 4 for sample 3 was set as the predetermined amplitude F and the probability of peeling of the AlSi electrode 4 with the predetermined amplitude F was 0.0074%. The probability of peeling of the AlSi electrode 4 being 0.0074% means that in the assembly process, the probability of a module being defective due to wire bonding to the AlSi electrode 4 of the semiconductor chip is 0.24% (i.e., a defective module occurs at a probability of $\frac{1}{420}$ modules). Thus, when the target sputtering temperature for the AlSi electrode 4 is increased, it was confirmed that the approximately linear curve of the probability of peeling of the AlSi electrode 4 may be caused to approach a direction that reduces the probability of peeling of the AlSi electrode 4 (in FIG. 9, direction of arrow).

As described above, according to the embodiment, the sputtering temperature of the AlSi electrode is set to a range of about 430 degrees C. to 577 degrees C., whereby the precipitate morphology of the Si nodules in the AlSi electrode may be caused to change from a prismatic structure to a dendrite structure, whereby growth of Si nodules having a prismatic structure becomes difficult. Further, the higher the sputtering temperature of the AlSi electrode is increased, Si nodules may be caused to branch finely at narrow intervals and grow in a horizontal direction parallel to the crystal surface. As a result, the height of the Si nodules in the AlSi electrode may be 2 μm or less, which is less than the thickness of the portion of the AlSi electrode (bonded portion of the AlSi electrode, where the bonding wire is bonded) that is crushed and made thinner by the bonding wire.

The height of the Si nodules in the AlSi electrode is 2 μm or less and thus, the Si nodules in the AlSi electrode are not pressed into layers beneath the AlSi electrode or the semiconductor substrate by the bonding wire. Further, Si nodules having a dendrite structure in the AlSi electrode grow in a horizontal direction parallel to the crystal surface, in a dendritic shape, whereby load and/or ultrasonic vibration imparted from the bonding wire is transmitted over a wide area, from the AlSi electrode to the layers therebelow and thus, stress does not concentrate locally in layers beneath the AlSi electrode. As a result, peeling at the AlSi electrode and the layers therebelow during wire bonding and the occurrence of cracks may be suppressed and peeling of the bonding wire during wire bonding may be suppressed. Thus, yield may be enhanced.

In the foregoing, the present invention is not limited to the embodiments described above and may be variously modified within a range not departing from the spirit of the invention.

According to the invention described above, silicon nodules in the AlSi electrode (surface electrode) are not pressed into layers beneath the AlSi electrode or the semiconductor substrate by the bonding wire. Further, a load, ultrasonic vibration, etc. imparted from the bonding wire is transmitted over a wide area, from the AlSi electrode to the layers therebelow and thus, stress does not concentrate locally in layers beneath the AlSi electrode. As a result, peeling at the AlSi electrode and the layers therebelow during wire bonding and the occurrence of cracks may be suppressed and peeling of the bonding wire during wire bonding may be suppressed.

The silicon carbide semiconductor device and the method of manufacturing a semiconductor device according to the present invention achieve an effect in that yield of the silicon carbide semiconductor device, which has an AlSi electrode, may be enhanced.

As described, the silicon carbide semiconductor device and the method of manufacturing a semiconductor device according to the present invention are useful for power semiconductor devices used in power converting equipment, power source devices such as those of various types of industrial machines and are particularly suitable in instances in which a bonding wire having a wire gauge (diameter) of 300 μm or greater is bonded to a surface electrode by ultrasonic welding.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device having a semiconductor substrate containing silicon carbide and a surface electrode provided at a surface of the semiconductor substrate, the method comprising:

sputtering and thereby depositing the surface electrode on the surface of the semiconductor substrate, the surface electrode containing an aluminum alloy that contains silicon, wherein a silicon concentration of the surface electrode is higher than a solid solubility of silicon in the surface electrode, and a temperature of the semiconductor substrate, or a temperature of a vicinity of a region in which the surface electrode is formed, or both is in a range of 430 degrees C. to 577 degrees C.

2. The method according to claim 1, wherein the solid solubility of silicon in the surface electrode is at least 0.3 wt %.

* * * * *